United States Patent [19]
Izawa

[11] Patent Number: 5,805,748
[45] Date of Patent: Sep. 8, 1998

[54] LASER BEAM SHAPING SYSTEM

[75] Inventor: Takao Izawa, Yokohama, Japan

[73] Assignee: Showa Optronic Co., Ltd., Japan

[21] Appl. No.: 838,942

[22] Filed: Apr. 23, 1997

[30] Foreign Application Priority Data

Dec. 27, 1996 [JP] Japan ................... 8-350727

[51] Int. Cl.⁶ .................................................. G02B 6/26
[52] U.S. Cl. ................... 385/15; 385/34; 385/31; 385/50; 385/33; 372/71
[58] Field of Search ........................ 385/15, 18, 27, 385/31, 33, 34, 36, 48, 50, 93, 129–132; 372/69–71, 75, 108, 101; 369/112; 359/209, 211, 204, 576, 583, 584, 586, 669, 671, 672, 834

[56] References Cited

U.S. PATENT DOCUMENTS

| | | | |
|---|---|---|---|
| 4,134,639 | 1/1979 | Di Vita | 385/50 |
| 4,178,066 | 12/1979 | Di Vita | 385/33 |
| 4,958,893 | 9/1990 | Nogouchi et al. | 359/205 |
| 5,127,068 | 6/1992 | Baer et al. | 385/34 |

*Primary Examiner*—Hemang Sanghavi
*Attorney, Agent, or Firm*—Marger, Johnson, McCollom & Stolowitz, P.C.

[57] ABSTRACT

A horizontally elongated laser beam is divided into a plurality of beam sections which are arranged along the horizontal direction and vertically deflected to different degrees by a beam deflecting beam guide, and the beam sections leaving the beam deflecting beam guide at different vertical positions are horizontally deflected by a beam converging beam guide to different degrees so that the beam sections may converge along a vertical line, and the laser beam which was initially laterally elongated may be shaped into a more circular cross section which is desirable for pumping a laser system and other applications. Each of the beam guides may consist of a plurality of transparent plate members which are placed one over the other, and each beam segment is conduct through a corresponding one of the plate member along a path parallel to the major surface of the plate members. The desired amount of deflection of each beam segment can be achieved by appropriate selection of the geometry and/or the refractive property of the corresponding plate member.

15 Claims, 6 Drawing Sheets

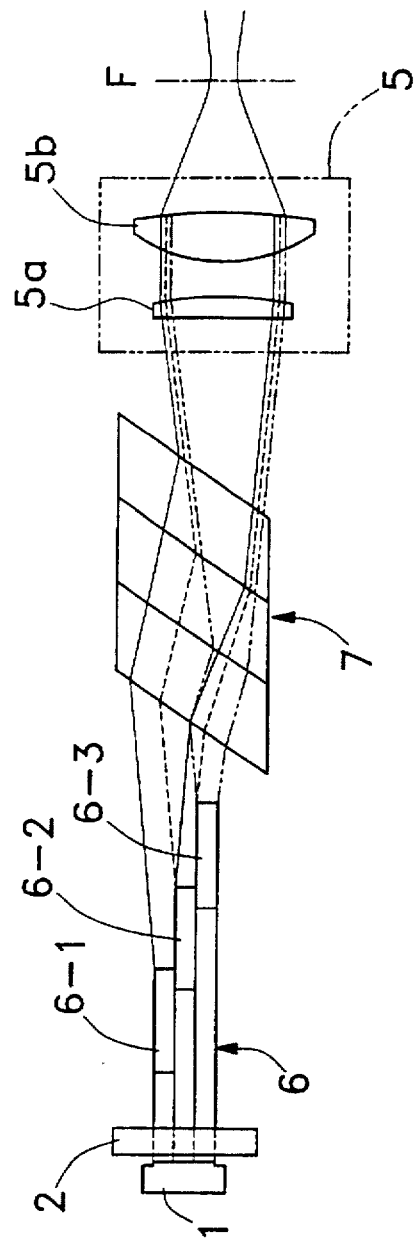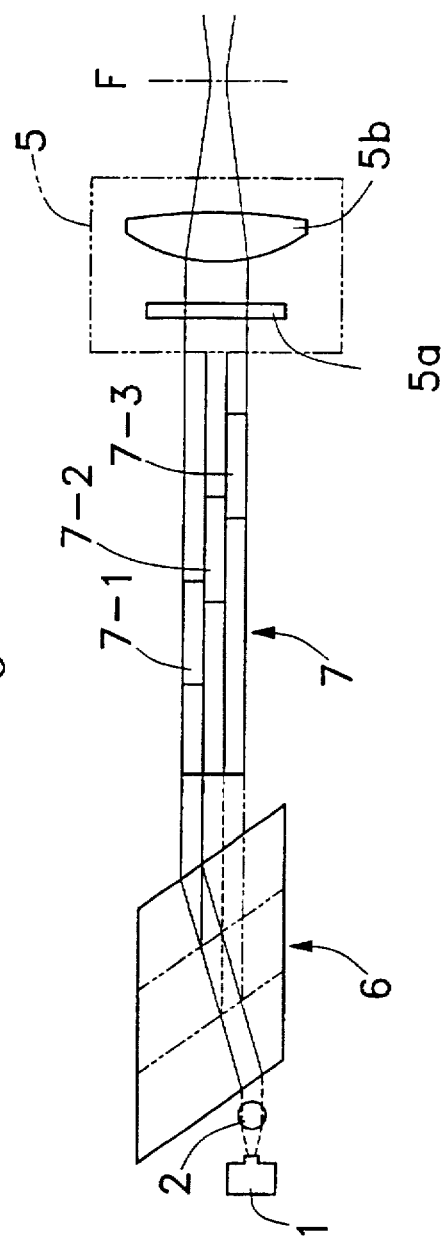

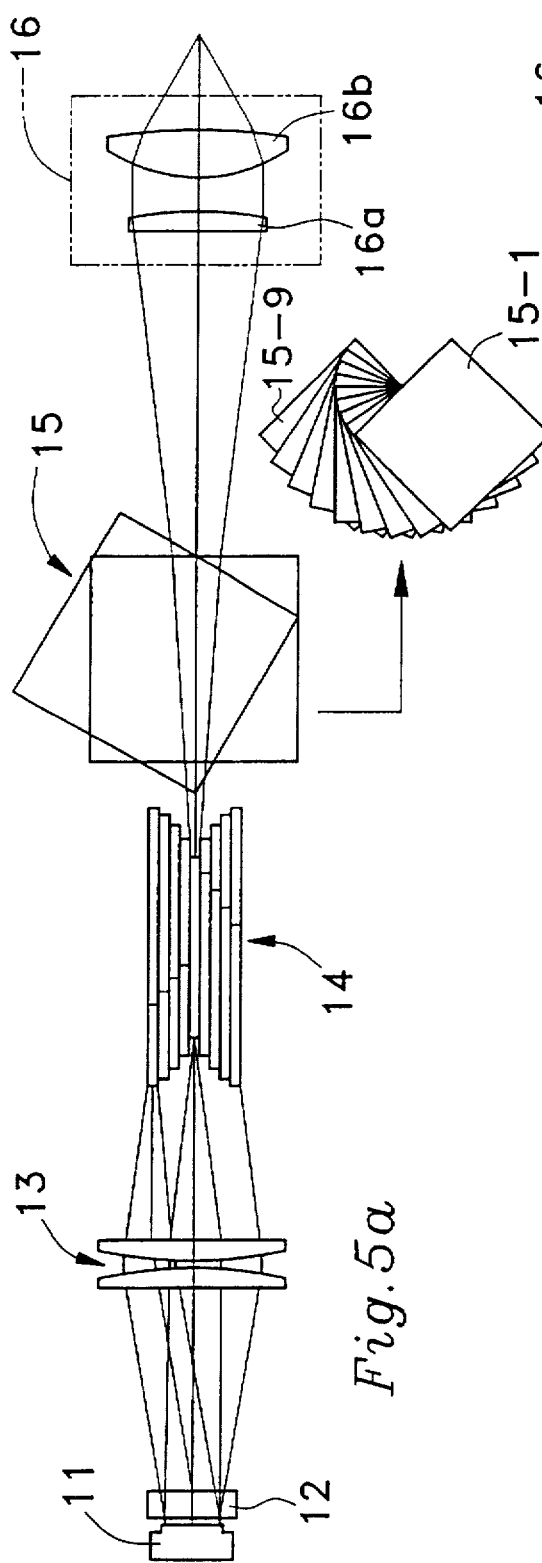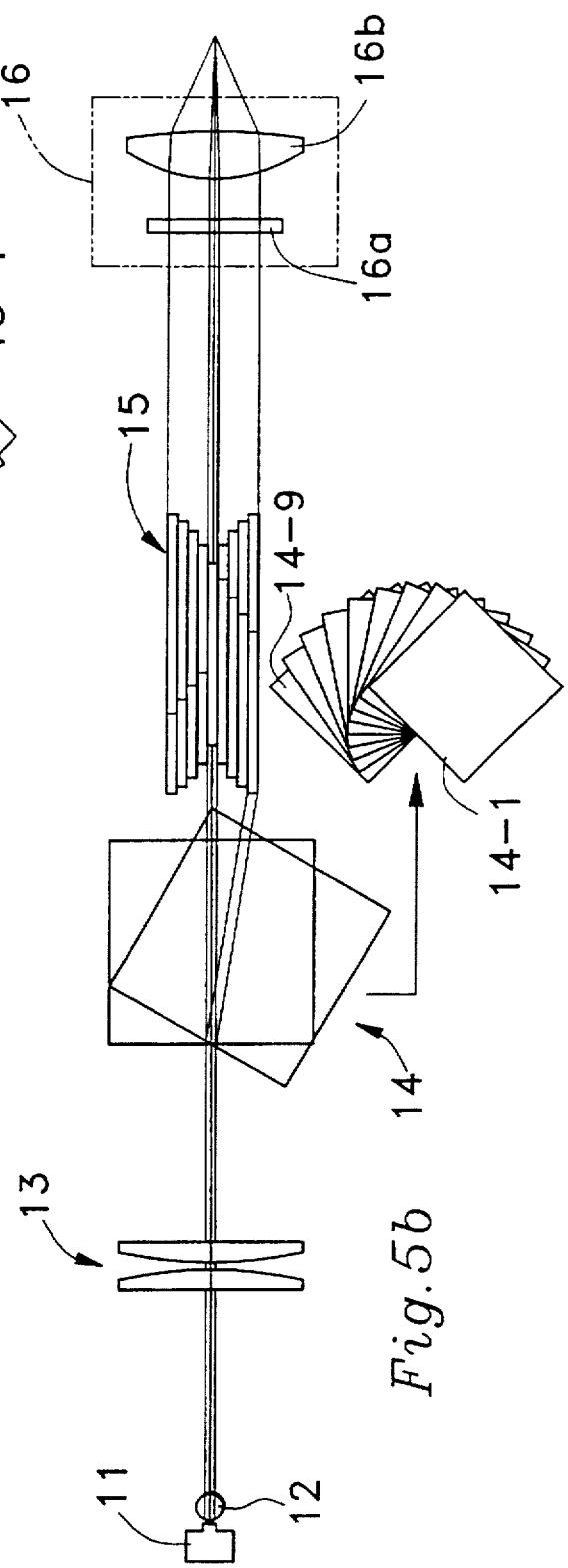
Fig.5a
Fig.5b

LASER BEAM SHAPING SYSTEM

TECHNICAL FIELD

The present invention relates to a laser beam shaping system for shaping a laser beam, and in particular to a laser beam shaping system for converting a laser beam having a laterally elongated configuration into a more circular configuration. The present invention is useful, not exclusively, in providing a pump source for solid-state laser systems which may be used in a wide field of applications including scientific researches, micro laser machining, plate making, and medical treatments.

BACKGROUND OF THE INVENTION

A laser beam source is normally desired to provide a high-density laser beam which can be readily collimated. To this end, the beam cross section is required to be as circular as possible, and as small as possible. For instance, when pumping a laser by using a high-power laser diode as a laser source, a high efficiency can be achieved by using an end-pump configuration, but the laser beam from the laser source is required to be collimated in the laser medium into a circular beam which is in the order of several hundred micrometers in diameter.

However, a high-power laser source having such characteristics are not economically available. A device called laser diode bar can provide a high output at a relatively low cost, but the laser beam produced from a laser diode bar is typically laterally elongated. In the case of a laser diode bar with a rated output of 10 to 20 Watts, its output facet is approximately 10 mm wide in a first direction, and approximately one micrometer in a second direction perpendicular to the first direction. Also, the beam emitted from a laser diode bar diverges very rapidly. The beam can be collimated into tens of micrometers in diameter in the second direction without any substantial difficulty, but cannot be collimated any more than approximately 3 mm in diameter in the first direction by using a normal optical arrangement employing a combination of cylindrical, spherical and aspherical lenses.

In the following description, for the sake of simplicity, it is assumed that the laser source has a horizontally elongated laser emitting facet. In other words, the first direction corresponds to the horizontal direction, and the second direction corresponds to the vertical direction.

For the reasons mentioned above, it is difficult to collimate a laser beam having an initial width of approximately 10 mm into a beam of less than 1 mm in diameter. Therefore, using a laser diode rod as a laser source for end-pumping a solid state laser inevitably results in a relatively poor conversion efficiency. Furthermore, the resulting output laser beam from the solid-state laser tends to have an elliptic cross section which is undesirable for most applications.

It is disclosed in the U.S. Pat. No. 5,127,068 to use a bundle of optical fibers to guide emissions from discrete emitters of a laser diode rod and converge them onto a laser system. The emissions from the laser diode bar can be converted into a relatively small and circular beam which is suitable for end-pumping a laser system. According to this system, when an optical fiber bundle is used in combination with a laser diode bar having a diameter of 10 mm (with a divergent angle of 15 degrees)×1 μm (with a divergent angle of 50 degrees), a laser beam can be produced from a region which is 600 μm in diameter with a divergent angle of 23 degrees (or with a numerical aperture of 0.2). When this laser beam is collimated by an aspherical lens with a numerical aperture of 0.2, it will be converted into a circular beam which is 600 μm in diameter. This is a significant improvement over the more conventional arrangement relying solely on optical lenses having a numerical aperture of 0.2 which can achieve only a laser beam of approximately 6 mm in width in the horizontal direction.

When a pair of laser diode rods each having an output of 20 W and a wavelength of 808 nm were used as a pumping source for end-pumping a Nd:YV0$_4$ solid-state laser system having an oscillating wavelength of 1,064 nm, the conversion efficiency was approximately 50%. However, the end-pumping method using an optical fiber bundle requires a substantially high cost for preparing the optical fiber bundle particularly because the fabrication process requires a time consuming and precise assembly process.

As another possible method for improving the conversion efficiency when a laser diode rod is used as a pumping source is to collimate the emissions from the laser diode rod only in the vertical direction, and side-pump the rod-shaped laser medium. This method is relatively inexpensive to implement, but gives rise to ineffective absorption of the pumping energy in the laser medium, and the resulting efficiency is significantly lower than that obtained by using an optical fiber bundle, typically in the range of 20%.

When the rated power output of the laser diode rod is 20 W for instance, the arrangement using an optical fiber bundle for beam shaping typically cost twice more than the more simple but less efficient side pumping arrangement.

BRIEF SUMMARY OF THE INVENTION

In view of such problems of the prior art, a primary object of the present invention is to provide a laser beam shaping system which allows a highly laterally elongated laser beam to be converted into a more circular laser beam in a both simple and economical manner.

A second object of the present invention is to provide a laser beam shaping system which can provided a high-power laser source for end pumping a laser system in an economical manner.

A third object of the present invention is to provide a laser beam shaping system which can significantly improve the pumping efficiency of a solid-state laser system.

According to the present invention, these and other objects can be accomplished by providing a laser beam shaping system, comprising: a laser source having an emitting surface, the emitting surface being substantially more elongated in a first direction than in a second direction which is perpendicular to the first direction; a beam deflecting beam guide including a plurality of beam guide members for dividing a laser beam leaving the laser source into a plurality of beam sections arranged along the first direction, and deflecting the beam sections in the second direction to different degrees; and a beam converging beam guide including a plurality of beam guide members for individually receiving the beam sections leaving the beam deflecting beam guide, and converging the beam sections with respect to the first direction so as to align the beam sections substantially along a line in parallel with the second direction.

Thus, the laterally elongated laser beam can be shaped into a substantially circular beam by using a relatively inexpensive arrangement. Typically, a collimator consisting of a cylindrical lens is placed next to the laser source for collimating a component of the laser beam leaving the laser source with respect the second direction before the laser beam enters the beam deflecting beam guide. Similarly, an imaging lens is placed next to the output end of the beam converging beam guide for converging the beam sections leaving the beam converging beam guide onto a focal point. The beam cross section may be enlarged by a relay lens interposed between the collimator and the beam deflecting beam guide. This simplifies the construction of the beam guides because the relay lens reduces the divergent angle of the laser beam.

According to a preferred embodiment of the present invention, the beam guide members of the beam deflecting beam guide comprise a plurality of transparent plate members each having a major surface extending in a plane defined by the second direction and a beam path, and planar end surfaces for receiving and emitting a corresponding one of the beam sections, the plate members being arranged one next to the other along the first direction with the end surfaces for receiving and/or emitting the beam sections being angularly displaced from each of the plate members to another around the first direction. This simplifies the production process particularly when the plate members are identically shaped. The beam converging beam guide may be similarly constructed.

According to another preferred embodiment of the present invention, the beam guide members of the beam deflecting beam guide comprise a plurality of transparent plate members each having a major surface defined by the second direction and a beam path, and planar surfaces for receiving and emitting a corresponding one of the beam sections at an oblique angle with respect to the beam path, the plate members being arranged one next to the other along the first direction and having different lengths along the beam path. This simplifies the assembly process because the amount of deflection can be easily adjusted by cutting each plate member from a common glass sheet or the like into an appropriate length. The beam converging beam guide may also be similarly constructed.

According to yet another preferred embodiment of the present invention, the beam guide members of the beam deflecting beam guide comprise a plurality of identically shaped transparent plate members each having a major surface defined by the second direction and a beam path, and planar surfaces for receiving and emitting a corresponding one of the beam sections at an oblique angle with respect to the beam path, the plate members being arranged one next to the other along first second direction and made of materials having different refractive indices. This requires a somewhat higher material cost, but the assembly work can be simplified. The beam converging beam guide may also be similarly constructed.

To improve the transmission efficiency when plate members are used as the beam guide members, the interfaces between adjacent plate members may be provided with a reflective property, for instance by means of an air gap or a reflective coating. The end surfaces across which beam sections enter and leave each plate members should be preferably coated with an anti-reflective layer.

BRIEF DESCRIPTION OF THE DRAWINGS

Now the present invention is described in the following with reference to the appended drawings, in which:

FIGS. 3(a) and 3(b) are a plan view and a side view similar to FIGS. 1(a) and 1(b), respectively, showing a second embodiment of the present invention;

FIGS. 5(a) and 5(b) are a plan view and a side view similar to FIGS. 1(a) and 1(b), respectively, showing a fourth embodiment of the present invention.

DETAILED DESCRIPTION OF THE PREFERRED EMBODIMENTS

Figure 1A:
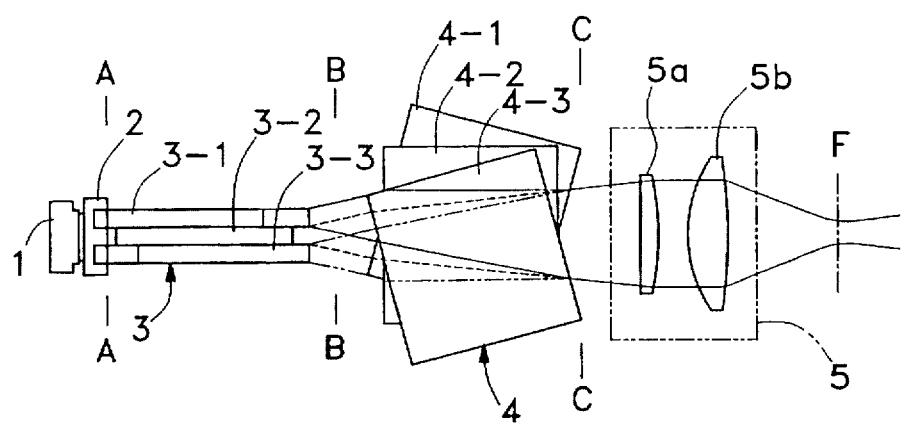
FIGS. 1(a) and 1(b) are diagrams of a first embodiment of the present invention which are shown in a plan view and a side view, respectively.
Figure 1B:
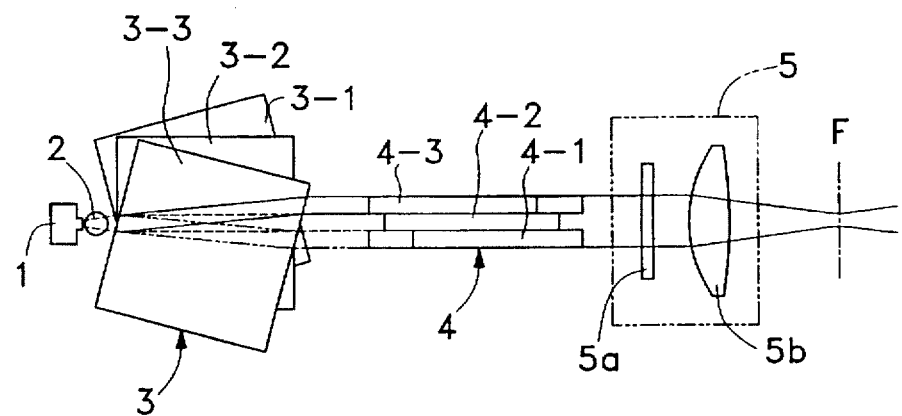

FIGS. 1(a) and 1(b) show a first embodiment of the present invention which includes a laser diode rod 1, a collimator 2, a beam deflecting beam guide 3, a beam converging beam guide 4, and an imaging lens 5. The laser diode rod 1 incorporates a large number of individual light emitting elements which are arranged along a lateral length thereof, and thereby defines a laterally elongated emitting surface. The collimator 2 consists of a fiber lens or a cylindrical lens which is aligned in parallel with the laser diode rod 1. The collimator 2 is placed immediately over the emitting surface of the laser diode rod 1 so that the laser beam which initially diverges in a vertical plane is converted into a substantially parallel beam, as seen in a vertical plane, which is however laterally elongated.

The beam which has passed through the collimator 2 is directed upon the beam deflecting beam guide 3 which in this embodiment consists of a plurality of substantially identical and vertically disposed transparent plate members 3-1 to 3-3 made of glass such as optical glass and quartz glass or transparent crystal which are placed one over the other. The transparent plate members 3-1 to 3-3 are rectangular in shape, and a middle one of the plate members 3-2 is oriented in such a manner that the light beam emitted from the collimator 2 enters and leaves the plate member 3-2 across perpendicularly disposed planar surfaces thereof. The remaining plate members 3-1 and 3-3 are placed over the middle plate member 3-2, and are slightly rotated around a line perpendicular to the major plane of the plate members with respect to the middle plate in two opposite directions.

The two sides (major surfaces) of each of the plate members is polished into a highly planar surface to avoid any irregular reflections, and are spaced from adjacent plate members by a small air gap larger than the wavelength so that the beam sections make total internal reflections on these surfaces. Alternatively, at least one of the two sides (major surfaces) may be coated with a metallic, dielectric or otherwise reflective layer. The end surfaces across which the beam sections pass through are also polished into a highly planar surface, and is desirably coated with an anti-reflective layer to minimize a transmission loss of the beam sections due to reflection as they pass across these surfaces. In the present embodiment, only three such plate members are illustrated, but, more typically, a larger number of such plate members are arranged. In this case, as one will readily appreciate, the rotational angle of each of the plate members progressively increases as the distance from the middle plate member increases.

Figure 2A:
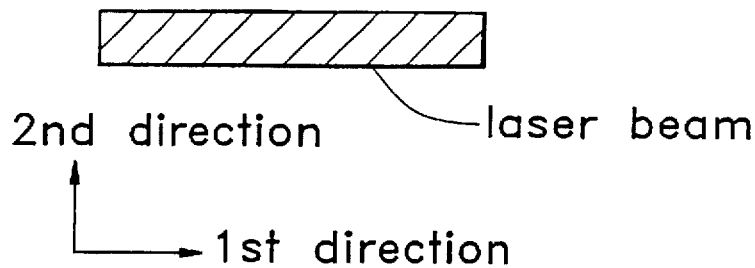
FIGS. 2(a) to 2(c) are diagrams showing the cross sectional shapes of the laser beam at planes A—A, B—B, and C—C of FIG. 1(a)
Figure 2B:
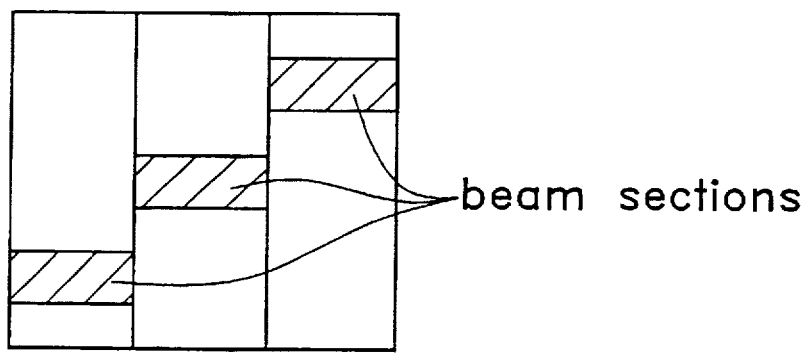

Thus, the laterally elongated light beam emitted from the collimator 2 (which is as shown in FIG. 2(a)) enters the beam deflecting beam guide 3, and is divided into a number of discrete beam sections which are individually guided through the corresponding plate members 3-1 to 3-3. The end surfaces of these plate members across which the beam sections pass through are polished into planar surfaces so as to avoid any irregular reflections. The middle beam section travels along a substantially straight path because the beam section enters and leaves the middle plate member 3-2 perpendicularly across the corresponding end surfaces of the plate member. On the other hand, each of the remaining beam sections enters and leaves the corresponding plate member 3-1 or 3-2 at an oblique angle with respect to the corresponding end surfaces. As a result, such beam sections are deflected or translated by the corresponding plate members to different degrees or amounts depending on the rotational angles of the plate members with respect to the middle plate as illustrated in FIG. 2(b). More specifically, each of these beam sections are vertically translated to different degrees. Because the plate members on either side of the middle plate members are rotated by a progressively increased angle as the distance from the middle plate member increases, the beam sections which were initially aligned along a horizontal line in cross section are deflected in such a manner that they align along an oblique line in cross section as illustrated in FIG. 2(b). Preferably, there is no substantial overlap in the vertical direction between the beam sections as they leave the beam deflecting beam guide 3.

The beam sections which passed through the beam deflecting beam guide 3 is then conducted into the beam converging beam guide 4 which includes a plurality of plate members 4-1 to 4-3 made of glass such as optical glass and quartz glass or transparent crystal material. The plate members are arranged one over the other and are rotated by a certain angle from one of the plate members to the other. In short, the plate members of the beam converging beam guide 4 arranged similarly to the plate members of the beam deflecting beam guide 3. However, the major surfaces of the plate members of the beam converging beam guide 4 are 90 degrees rotated around the optical axial line, or, in other words, are oriented in the horizontal direction. The beam converging beam guide 4 is associated with the beam deflecting beam guide 3 in such a manner that each of the beam sections emitted from the beam deflecting beam guide 3 enters a corresponding one of the plate members of the beam converging beam guide 4.

Figure 2C:
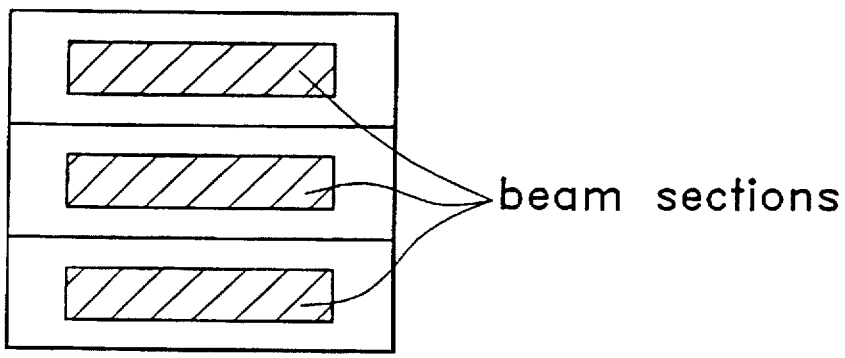

The beam segments thus leave the deflecting beam guide 3 at different vertical positions and enter the corresponding plate members 4-1 to 4-3 of the beam converging beam guide 4. The plate members 4-1 to 4-3 of the beam converging beam guide 4 each translate the path of the corresponding beam section in the lateral direction in such a manner that the beam sections leaving the beam converging beam guide 4 substantially align along a vertical line as illustrated in FIG. 2(c). In the case of the beam converging beam guide 4, because the vertical divergent angle of each of the beam sections passing through the plate members of the beam converging beam guide 4 is relatively small (<0.5 degrees), and is less likely to impinge upon the two sides (major surfaces), these surfaces are not necessarily required to be given with a reflective property which may be achieved by the provision of an air gap between adjacent plate members or reflective layers coated on the majors surfaces of the plate members.

The laser beam leaving the beam converging beam guide 4 is directed to the imaging lens 5 provided in the next stage. The imaging lens 5 may comprise a cylindrical lens 5a and an aspherical lens 5b so that the incident laser beam is converted into a parallel beam by the cylindrical lens 5a and is focused, in both vertical and horizontal directions, onto a small spot on a focal plane F by the aspherical lens 5b. The cylindrical lens 5a is properly designed so that the focal point of the vertical component of the laser beam and the focal point of the horizontal component of the laser beam coincide on the common focal plane F.

The lateral dimension of the laser beam incident to the imaging lens 5 is inversely proportional to the number of the plate members of the beam guides 3 and 4, and can be therefore reduced as desired. The vertical dimension of the laser beam incident to the imaging lens 5 is dictated by the thickness of the plate members of the beam deflecting beam guide 3, and can be therefore controlled as desired, although not so freely as the lateral dimension of the laser beam incident to the imaging lens 5. However, because the laser beam as it leaves from the collimator 2 is relatively parallel with respect to the vertical direction, and has a relatively small divergent angle, the vertical dimension of the laser beam as it leaves the beam converging beam guide can be made no larger than the horizontal direction thereof. Thus, by suitably selecting the number of the plate members of the beam deflecting beam guide 3 and the beam converging beam guide 4, it is possible to shape the laser beam into a substantially circular cross section.

For instance, suppose that the emitting surface of the laser beam rod 1 measures 10 mm (horizontal)×1 μm (vertical), and the parallelism of the laser beam achieved by the collimator 2 is in the order of 0.5 degrees with respect to the vertical direction. This degree of parallelism can be readily achieved by using a commercially available collimator. In this case, the vertical dimension of the laser beam leaving the beam converging beam guide 4 would be kept sufficiently small as long as the number of the plate members of the beam deflecting beam guide 3 is no more than 20.

This is more specifically described in the following taking an example where three plate members are used in each of the beam deflecting beam guide 3 and the beam converging beam guide 4. With respect to the horizontal direction, the outer beam sections 4-1 and 4-3 which are divided and vertically translated by the beam deflecting beam guide 3 are laterally translated by the corresponding plate members of the beam converging beam guide 4 into vertical alignment with the middle beam section when they finally leave the plate members of the beam converging beam guide 4. Therefore, the vertical dimension of the laser beam is thus reduced by the factor of three as it passes through the beam deflecting beam guide 3 and the beam converging beam guide 4. The vertical dimension of the laser beam is increased by the factor of three, but it does not create any significant problem because the vertical component of the laser beam is more than 50 times more parallel than the horizontal component, and such a slight divergence in the vertical direction is quite insignificant in view of the substantial reduction in the horizontal dimension of the laser beam which is achieved by this arrangement.

In the illustrated embodiment, the planar surfaces of each plate member across which the beam section enters and leaves were parallel to each other, but may define any angle relative to each other as long as a desired amount of beam section deflection is achieved as will be readily appreciated by a person skilled in the art. Also, the rotational angle of each of the plate members around the horizontal line progressively increased in the illustrated embodiment, but it is not essential for the present invention. As long as the plate members of the beam deflecting beam guide 3 are rotated by different angles, preferably at an equal angular interval, the order in which the plate members are placed one over the other is insignificant. Obviously, the arrangement of the plate members of the beam converging beam guide 4 is dictated by the arrangement of those of the beam deflecting beam guide 3 so that the beam sections may be vertically aligned as they leave the beam converging beam guide 4.

The deflection or the translation of the laser beam sections in the first embodiment was achieved by using plate members which have a refractive index which is different from that of air, and the degree of deflection was determined by the inclination angle of the end surfaces of the plate members across which the beam sections pass through as well as the refractive index of the material of the plate members. The same goal can be achieved by changing the length of the plate members. By suitably changing the length of the path of each beam section inside the plate member, it is possible to adjust the degree of deflection of each beam section without changing the inclination angle of the end surfaces of the plate members. Also, by changing the refractive index of the material of the plate member from one plate member to the other, it is possible to adjust the degree of deflection of each beam section without changing the inclination angle of the end surfaces of the plate members or the length of each plate member.

FIGS. 3(a) and 3(b) illustrate a second embodiment of the present invention in which the degree of deflection is adjusted by changing the path length of each light beam inside the plate member. In these drawings, the parts corresponding to those of the previous embodiments are denoted with like numerals.

According to the second embodiment, the beam deflecting beam guide 6 comprises a plurality of vertically oriented plate members 6-1 to 6-3 each having a parallelepiped shape in such a manner that the beam sections enter and leave the corresponding plate members at an identical angle from one plate member to another. Only the length of the beam path inside the plate member is made different from one plate member to another. In particular, the two outer plate members 6-1 and 6-3 is shorter and longer than the middle plate member 6-2 by an equal length, respectively. Therefore, the laterally elongated laser beam entering the beam deflecting beam guide 6 is divided into three beam sections which are individually guided by the three vertically oriented plate members 6-1 to 6-3, and leave the beam deflecting beam guide 6 at different vertical positions.

The beam converging beam guide 7 of the second embodiment is also similar in structure to the beam deflecting beam guide 6 thereof, only rotated by 90 degrees around the optical axial line. The beam sections which entered the individual or different plate members of the beam converging beam guide 7 are deflected in horizontal direction in such a manner that the beam sections leaving the beam converging beam guide 7 are aligned along a vertical line.

Thus, according to the second embodiment also, by suitably changing the number of the plate members in each of the beam deflecting beam guide 6 and the beam converging beam guide 7, and the length of each of the plate members 7-1 to 7-3, it is possible to shape the laser beam which was initially laterally elongated into a substantially circular beam which is more suitable for favorable focusing by the imaging lens 5.

Figures 4A, 4B:
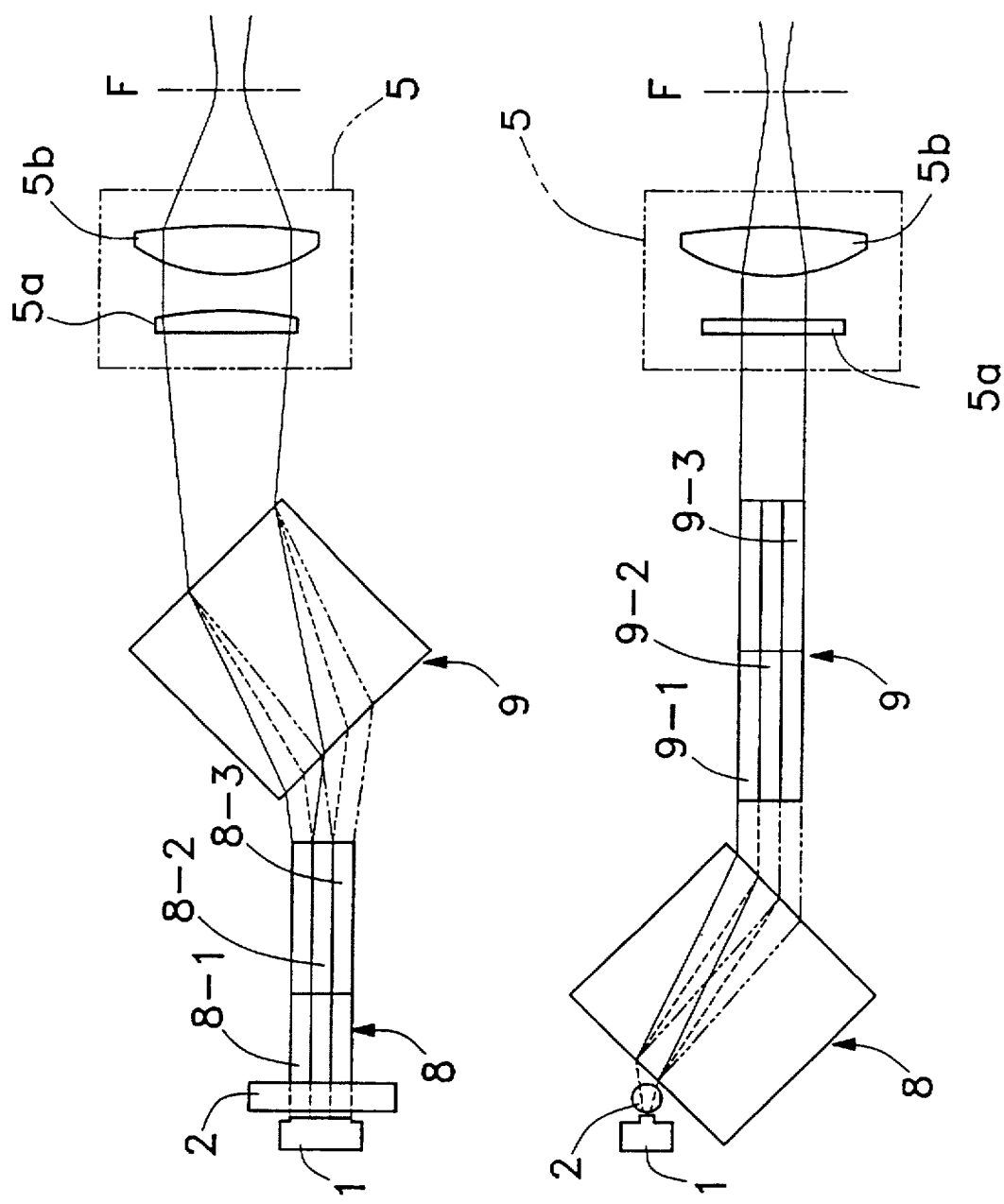
FIGS. 4(a) and 4(b) are a plan view and a side view similar to FIGS. 1(a) and 1(b), respectively, showing a third embodiment of the present invention.

FIGS. 4(a) and 4(b) illustrate a third embodiment of the present invention in which the degree of deflection is adjusted by changing the refractive index of each of the plate members. In these drawings, the parts corresponding to those of the previous embodiments are denoted with like numerals.

In this case, the beam deflecting beam guide 8 and the beam converging beam guide 9 are each formed by a plurality of identically shaped and identically oriented plate members 8-1 to 8-3 and 9-1 to 9-3, but the materials for the plate members are given with progressively increasing refractive indices from one plate member to the next. In the illustrated embodiment, each of the plate members is oriented such that the incident beam enters the planar end surface of each plate member at 45 degree angle with respect to the line perpendicular to the end surface. The plate members are identically shaped, and conformally placed one over the other.

In this embodiment also, the laser beam which has entered the beam deflecting beam guide 8 is divided into beam sections which are then individually guided inside the corresponding plate members 8-1 to 8-3, and leave the corresponding plate members from different vertical positions because of the difference in refractive index from one plate member to the other. The vertical positions of these beam sections leaving the beam deflecting beam guide 8 are adjusted by selecting the refractive indices of the material for the plate members so that there is no substantial overlap in the vertical direction between the beam sections as they leave the beam deflecting beam guide 8.

The beam converging beam guide 9 is constructed in a similar manner as the beam deflecting beam guide 8, but the plate members 9-1 to 9-3 of the beam converging beam guide 9 are rotated by 90 degrees around the optical axial line with respect to those of the beam deflecting beam guide 8. The refractive indices of the plate members are selected so that the beam sections leaving the beam converging beam guide 9 substantially align along a vertical line.

FIGS. 5(a) and 5(b) show a fourth embodiment of the present invention. The laser source 11 in this case consists of a semiconductor laser of 20 Wcw which is marketed by SDL, INC. of San Jose, Calif. under the model name of SDL3470-S. This semiconductor laser commonly known as laser diode bar produces a laser beam which is 10 mm wide in the horizontal direction and 1 µm wide in the vertical direction. The divergent angle of this laser beam is 15 degrees in the horizontal direction, and 50 degrees in the vertical direction. The wavelength of the laser emitted from this device is 810 nm.

The laser beam emitted from the laser diode bar 11 is collimated with respect to the vertical direction by using a collimator 12 including a gradient cylindrical lens of a 1 mm diameter which is marketed by Doric Lenses, Inc. of U.S.A. The laser beam leaving the collimator 12 has a vertical dimension of 0.5 mm and a divergent angle of 0.4 degrees. The system further includes a relay lens 13 consisting of a pair of convex lenses having a focal length of 60 mm and an outer diameter of 40 mm to form a telecentric optical system which enlarges the collimated beam (10 mm×0.5 mm) by the factor of two (or into a beam of 20 mm×1.0 mm) so as to reduce the divergent angle to 7.5°×0.2°.

Enlarging the beam diameter by using a relay lens provides the advantage of allowing the use of a relatively thick plate members for the beam deflecting beam guide 14 and the beam converging beam guide 15. Plate members having a larger thickness are relatively less expensive to manufacture. The use of a relay lens is not essential for implementing the present invention, but is preferable from practical view points.

The beam deflecting beam guide 14 comprises nine rectangular quartz plate members 14-1 to 14-9 each measuring 50 mm×50 mm×2.3 mm which are arranged one over the other so as to extend in parallel with a plane defined by the beam path and the vertical direction. Each of the plate members are rotated around a horizontal line perpendicular to the beam path with respect to the next plate member in a manner similar to a deck of cards twisted into the shape of a fan. The middle plate member 14-5 is oriented such that the front and rear end surfaces thereof extend perpendicularly to the incident beam section and the remaining plate members on either side thereof are progressively rotated in different directions.

In this embodiment, the plate members 14-1 to 14-9 are arranged such that the vertical positions of the adjacent beam sections leaving the beam deflecting beam guide 14 are 2.3 mm apart from each other. By so selecting, it is possible to construct the beam converging beam guide 15 identically to the beam deflecting beam guide 14, and to thereby reduce the manufacturing cost. However, according to the present invention, the beam converging beam guide 15 may include a different number of plate members from that of the beam deflecting beam guide 14, or may include plate members which have a different thickness from that of the beam deflecting beam guide 14.

The two sides of each of the plate members 14-1 to 14-9 are coated with a multi-layer dielectric reflective coating which ensures a total internal reflection for those beams components having an incident angle of 80 degrees or more. Such reflective coatings are merely for improving the transmission efficiency by reflecting a small fraction of the beam sections guided by each plate member which may impinge upon the interface, and are not essential for the implementation of the present invention. Alternatively, an air gap in the order of 50 μm may be defined between each adjacent pair of the plate members so as to form an optically reflective interface between them. The end surfaces of each plate member are each coated with an anti-reflection coating, again, so as to minimize the transmission loss.

The beam converging beam guide 15 is thus constructed substantially identically to the beam deflecting beam guide 14, but is rotated by 90 degrees around the optical axial line with respect to the beam deflecting beam guide 14. In this case, the parallelism of the beam sections were so good that there is less need for reflective surfaces between adjacent plate members 15-1 to 15-9. However, the structure of the beam converging beam guide 15 may be variously modified as desired as long as the beam sections incident to the beam converging beam guide 15 are individually guided by the plate members 15-1 to 15-9, and are converged along a common vertical line.

The laser beam finally leaving the beam shaping system of this embodiment was approximately 2.3 mm wide with a divergent angle of 7.5 degrees with respect to the horizontal direction, and was approximately 20.7 mm (2.3 mm×9) wide with a divergent angle of 0.2 degrees with respect to the vertical direction. According to the known theory of optics, the product of a diameter and a divergent angle of a beam is approximately inversely proportional to the possible size of the beam spot into which the beam can be converged. Thus, the beam shaping system of the present invention can reduce the horizontal width of the beam approximately by the factor of ten as compared to the case where the beam shaping system is not used.

An imaging lens 16 comprising a cylindrical convex lens 16a and a aspherical lens 16b is placed behind the beam converging beam guide 15 so that the laser beam leaving the imaging lens may converge into a smallest spot, with respect to both the horizontal and vertical directions, on a common focal plane. In this case, the cylindrical lens 16a measures 30 mm×300 mm in size, and has a focal length of 200 mm, and the aspherical lens 16b has a focal length of 50 mm so that the NA is approximately 0.29 in the horizontal direction, and 0.24 in the vertical direction.

The laser beam finally converged by the imaging lens 16 was 500 μm (horizontal)×400 μm (vertical) as measured with a beam profiler, and this is highly suitable for pumping a solid-state laser. Furthermore, the transmission efficiency of the beam shaping system was approximately 88% which is a significant improvement over the prior art.

Figure 6:
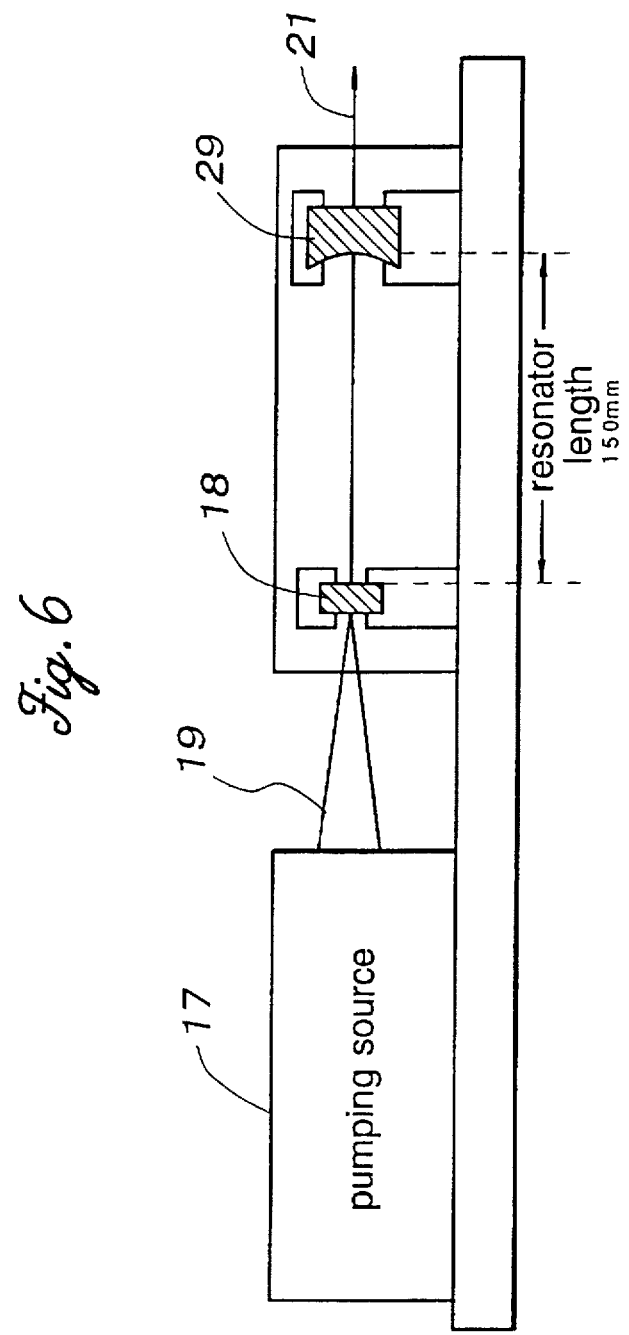
FIG. 6 is a side view showing a laser system in combination with the beam shaping system of the present invention.

A solid-state laser system using the laser shaping system illustrated in FIG. 5 was actually constructed as illustrated in FIG. 6. This solid-state laser system employs a Nd:YVO4 rod (which measures 3 mm×3 mm×1 mm and had a Nd concentration of less than 1%) as a laser medium 18. An axial end surface of this rod facing the imaging lens 16 was coated with a layer which totally reflects light having a wavelength of 1.064 nm and totally (100%) transmits light having a wavelength of 810 nm, and the other axial end surface was coated with a layer which prevents reflection of light having a wavelength of 1.064 nm. A laser beam having a wavelength of 810 nm and measuring 500 μm (horizontal) ×400 μm (vertical) which was obtained by the laser beam shaping system was impinged upon the laser medium 18 as a pumping laser beam 19. The output mirror 29 consisted of a concave mirror having a radius of curvature of 1 mm, and a resonator length of 150 mm was defined between the output mirror 29 and the laser medium 18.

According to this solid-state laser system, when the pumping power of the pumping laser beam 19 for the laser medium was 19 W, the output power of the output laser beam 21 as it leaves the output mirror was 6 W at the wavelength of 1.064 nm. Therefore, the conversion efficient was approximately 40% which is comparable to the efficiency achieved by the optical fiber bundle. The present invention is however significantly less expensive than the system relying of an optical fiber bundle as mentioned above.

As described above, according to the laser beam shaping system of the present invention, a laser beam having a laterally elongated configuration can be both economically and efficiently shaped into a more circular beam involving a relatively small divergent angle. Therefore, the present invention offers a highly favorable pumping source for solid-state laser systems.

The beam guide can be constructed in a number of different ways. When a plurality of identically shaped plate members made of an identical material are used for the beam guides as was the case in the first and fourth embodiments of the present invention, the beam guides can be mass produced at low cost. The degree or amount of deflecting the beam sections can be also adjusted by changing the length of the plate members along the beam path as was the case in the second embodiment, and the manufacturing cost in this case will be equally small. When the refractive property of the material for each of the plate members is varied while keeping the shapes of the plate members substantially identical as was the case in the third embodiment, the material cost may be somewhat high, but the assembly process will be significantly simplified so that the overall cost may be no more than those of the other embodiments.

Although the present invention has been described in terms of preferred embodiments thereof, it is obvious to a person skilled in the art that various alterations and modifications are possible without departing from the scope of the present invention which is set forth in the appended claims.

What we claim is:

1. A laser beam shaping system, comprising:
   a laser source having an emitting surface, said emitting surface being substantially more elongated in a first direction than in a second direction which is perpendicular to said first direction;
   a beam deflecting beam guide including a plurality of beam guide members for dividing a laser beam leaving said laser source into a plurality of beam sections arranged along said first direction, and deflecting said beam sections in said second direction to different degrees; and
   a beam converging beam guide including a plurality of beam guide members for individually receiving said beam sections leaving said beam deflecting beam guide, and converging said beam sections with respect to said first direction so as to align said beam sections substantially along a line in parallel with said second direction.

2. A laser beam shaping system according to claim 1, further comprising a collimator for collimating a component of the laser beam leaving said laser source with respect said second direction before said laser beam enters said beam deflecting beam guide.

3. A laser beam shaping system according to claim 2, wherein said collimator comprises a cylindrical lens extending in said first direction.

4. A laser beam shaping system according to claim 2, further comprising a relay lens interposed between said collimator and said beam deflecting beam guide for enlarging a beam cross section.

5. A laser beam shaping system according to claim 1, further comprising an imaging lens for converging said beam sections leaving said beam converging beam guide onto a focal point.

6. A laser beam shaping system according to claim 1, wherein said beam guide members of said beam deflecting beam guide comprise a plurality of transparent plate members each having a major surface extending in a plane defined by said second direction and a beam path, and planar end surfaces for receiving and emitting a corresponding one of said beam sections, said plate members being arranged one next to the other along said first direction with said end surfaces for receiving and/or emitting said beam sections being angularly displaced from each of said plate members to another around said first direction.

7. A laser beam shaping system according to claim 6, wherein said plate members of said beam deflecting beam guide are substantially identically shaped, and are arranged one next to the other along said first direction and angularly displaced from each other around said first direction.

8. A laser beam shaping system according to claim 1, wherein said beam guide members of said beam converging beam guide comprise a plurality of transparent plate members each having a major surface extending in a plane defined said first direction and a beam path, and planar end surfaces for receiving and emitting a corresponding one of said beam sections, said plate members being arranged one next to the other along said second direction with said end surfaces for receiving and/or emitting said beam sections being angularly displaced from each of said plate members to another around said second direction.

9. A laser beam shaping system according to claim 8, wherein said plate members of said beam converging beam guide are substantially identically shaped, and are arranged one next to the other along said second direction and angularly displaced from each other around said second direction.

10. A laser beam shaping system according to claim 1, wherein said beam guide members of said beam deflecting beam guide comprise a plurality of transparent plate members each having a major surface defined by said second direction and a beam path, and planar surfaces for receiving and emitting a corresponding one of said beam sections at an oblique angle with respect to said beam path, said plate members being arranged one next to the other along said first direction and having different lengths along said beam path.

11. A laser beam shaping system according to claim 1, wherein said beam guide members of said beam converging beam guide comprise a plurality of transparent plate members each having a major surface defined by said first direction and a beam path, and planar surfaces for receiving and emitting a corresponding one of said beam sections at an oblique angle with respect to said beam path, said plate members being arranged one next to the other along said second direction and having different lengths along said beam path.

12. A laser beam shaping system according to claim 1, wherein said beam guide members of said beam deflecting beam guide comprise a plurality of identically shaped transparent plate members each having a major surface defined by said second direction and a beam path, and planar surfaces for receiving and emitting a corresponding one of said beam sections at an oblique angle with respect to said beam path, said plate members being arranged one next to the other along said first direction and made of materials having different refractive indices.

13. A laser beam shaping system according to claim 1, wherein said beam guide members of said beam converging beam guide comprise a plurality of identically shaped transparent plate members each having a major surface defined by said first direction and a beam path, and planar surfaces for receiving and emitting a corresponding one of said beam sections at an oblique angle with respect to said beam path, said plate members being arranged one next to the other along said second direction and made of materials having different refractive indices.

14. A laser beam shaping system according to claim 1, wherein said beam guide members of each of said beam guides comprise a plurality of transparent plate members having a major surface extending in parallel with a beam path, and a small air gap is formed between adjacent ones of said plate members.

15. A laser beam shaping system according to claim 1, wherein said beam guide members of each of said beam guides comprise a plurality of transparent plate members having a major surface extending in parallel with a beam path, and a reflective coating is formed at least on one side of each of said plate members.

* * * * *